(12) United States Patent  
Vielemeyer

(10) Patent No.: US 8,946,902 B2  
(45) Date of Patent: Feb. 3, 2015

(54) DEVICE AND METHOD FOR MANUFACTURING A DEVICE

(71) Applicant: Infineon Technologies Austria AG, Villach (AT)

(72) Inventor: Martin Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/773,421

(22) Filed: Feb. 21, 2013

(65) Prior Publication Data

US 2014/0232006 A1 Aug. 21, 2014

(51) Int. Cl.  
*H01L 23/48* (2006.01)  
*H01L 21/3065* (2006.01)

(52) U.S. Cl.  
CPC ............ *H01L 23/48* (2013.01); *H01L 21/3065* (2013.01)  
USPC .......................................... 257/773; 438/666

(58) Field of Classification Search  
CPC ............ H01L 24/31; H01L 2924/1515; H01L 2924/15151; H01L 2224/73263–2224/73269; H01L 23/48

USPC .......................................... 257/773; 438/666  
See application file for complete search history.

(56) References Cited

U.S. PATENT DOCUMENTS

| | | | | |
|---|---|---|---|---|
| 6,326,689 | B1 * | 12/2001 | Thomas .................. | 257/734 |
| 7,084,488 | B2 * | 8/2006 | Thornton et al. .......... | 257/666 |
| 7,390,698 | B2 * | 6/2008 | Thornton et al. .......... | 438/106 |
| 2006/0220241 | A1 * | 10/2006 | Thornton et al. .......... | 257/734 |
| 2007/0290782 | A1 * | 12/2007 | Yokoyama et al. ......... | 336/200 |
| 2008/0315407 | A1 * | 12/2008 | Andrews et al. ........... | 257/735 |
| 2012/0181676 | A1 * | 7/2012 | Tsui et al. ................ | 257/675 |

* cited by examiner

*Primary Examiner* — Allan R Wilson  
(74) *Attorney, Agent, or Firm* — Slater & Matsil, L.L.P.

(57) ABSTRACT

A device includes a semiconductor chip including a frontside, a backside, and a side surface extending from the backside to the frontside. The side surface includes a first region and a second region, wherein a level of the first region is different from a level of the second region. The device further includes an electrically conductive material arranged over the backside of the semiconductor chip and over the first region of the side surface, wherein the second region of the side surface is uncovered by the electrically conductive material.

19 Claims, 4 Drawing Sheets

DEVICE AND METHOD FOR MANUFACTURING A DEVICE

TECHNICAL FIELD

This invention relates to devices including a semiconductor chip. The invention further relates to methods for manufacturing such devices.

BACKGROUND

Devices may include one or multiple semiconductor chips. An electrically conductive material may be arranged over a backside of an included semiconductor chip. Devices including semiconductor chips and methods for manufacturing such devices constantly have to be improved. In particular, it may be desirable to improve an operation of the devices and/or to avoid a malfunction of the devices. In addition, it may be desirable to provide effective methods for manufacturing the devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION OF ILLUSTRATIVE EMBODIMENTS

Figure 1:
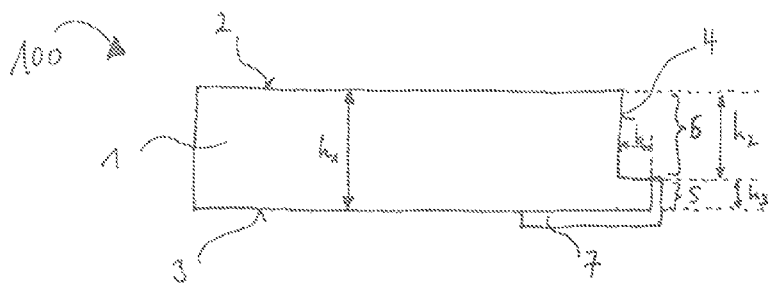
FIG. 1 schematically illustrates a cross-sectional view of a device 100 in accordance with the disclosure.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

The devices and methods described herein may include or employ one or multiple semiconductor chips. The semiconductor chips may be of arbitrary type, may be manufactured by different technologies and may, e.g., include integrated electrical, electro-optical or electro-mechanical circuits and/or passives. For example, the semiconductor chips may be configured as power semiconductor chips. The semiconductor chips may include control circuits, microprocessors or microelectromechanical components. In addition, the devices described herein may include logic integrated circuits to control the integrated circuits of other semiconductor chips, for example the integrated circuits of power semiconductor chips. The semiconductor chips need not be manufactured from specific semiconductor material, for example Si, SiC, SiGe, GaAs, GaN, any other III-V semiconductor and may contain inorganic and/or organic materials that are not semiconductors, such as for example insulators, plastics or metals. A semiconductor wafer and semiconductor chips manufactured thereof may have a thickness smaller than 750 μm (micrometers), in particular smaller than 200 μm (micrometers), and even more particular smaller than or equal to 100 μm (micrometers).

In one example, the semiconductor chips may have a vertical structure, i.e., the semiconductor chips may be manufactured such that electric currents may flow in a direction perpendicular to the main faces of the semiconductor chips. A semiconductor chip having a vertical structure may have electrodes on its two main faces, i.e., on its top side and bottom side (the bottom side may also be referred to as backside herein). In particular, the devices described herein may include a power semiconductor chip that may have such vertical structure. The vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), power bipolar transistors, power diodes, etc. For example, the source electrode and gate electrode of a power MOSFET may be located on one main face while the drain electrode of the power MOSFET may be arranged on the other main face.

The terms "frontside" and "backside" of a semiconductor chip or a semiconductor wafer may be used herein. The term "frontside" may particularly relate to a main face of the semiconductor chip that may include at least one of a doped region, an electrical component, a microelectronic component, an integrated circuit, etc. Semiconductor chips may be manufactured from semiconductor wafers that may serve as a substrate for microelectronic devices to be built in and over the semiconductor wafer. The integrated circuits may be manufactured by doping, ion implantation, deposition of materials, photolithographic patterning, etc. The manufacturing processes usually may be performed on a specific main surface of the semiconductor wafer which may also be referred to as the "frontside" of the semiconductor wafer. After separating the individual semiconductor chips from the semiconductor wafer, the "frontside" of the semiconductor wafer may consequently become the "frontside" of the separated semiconductor chips. Contrarily, the term "backside" of a semiconductor chip may refer to a main surface of the semiconductor chip that may be arranged opposite to the frontside of the semiconductor chip. The backside of the semiconductor chip may be free of electronic components, i.e., it may consist of the semiconductor material.

The devices and methods described herein may include or employ an electrically conductive material arranged over the semiconductor chip. The electrically conductive material may particularly have the function of a contact element (or contact electrode). That is, the electrically conductive layer may allow an electrical contact to be made with integrated circuits included in the semiconductor chip. In particular, the electrically conductive material may correspond to a backside metallization (or a backside electrode) of a power semiconductor.

The electrically conductive material may include one or more electrically conductive layers. The electrically conductive layers may be manufactured with any desired geometric shape and/or any desired material composition. The electrically conductive layers may, for example, have the form of a layer covering an area. Any desired metal, for example Cu, Ni, Sn, Au, Ag, Pt, Pd, Al, V, Ti and an alloy of one or more of these metals may be used as the material. The electrically conductive layers need not be homogenous or manufactured from just one material. Various compositions and concentrations of the materials included in the electrically conductive layers may be possible.

The electrically conductive layers may be applied over the semiconductor chip or semiconductor wafer, for example on its backside. It should be appreciated that any such terms as "formed" or "applied" are meant to cover literally all kinds and techniques of applying layers. In particular, they are meant to cover at least one of a laminating technique, sputtering, plating, molding, CVD (Chemical Vapor Deposition), PVD (physical vapor deposition), evaporation, PECVD (plasma enhanced CVD), hybrid physical-chemical vapor deposition (HPCVD), squeegeeing, printing, dispensing, spin-coating, etc.

A dicing process may be used for manufacturing the devices described herein. In particular, the dicing process may be used to divide or separate a semiconductor wafer into multiple semiconductor chips. The dicing process may include a step of providing a trench (or separation trench) extending at least partly into the semiconductor wafer at one or more predetermined positions at which the semiconductor wafer is to be divided into multiple semiconductor devices. Such trench may have an arbitrary shape and dimension that may depend on the applied dicing technique. In this connection, the term "width" of a trench may be used. The width of a trench or a part thereof may, e.g., be defined as a maximum dimension of the trench, for example in a direction parallel to the frontside of the semiconductor wafer. Alternatively, the width of a trench may also be defined as an average dimension of the trench. It is understood that a trench may include multiple parts (or sections) that may differ in their respective width. For providing a trench (or dicing a semiconductor wafer), a suitable dicing technique may be applied, e.g., blade dicing (sawing), laser dicing, etching, sputter etching, vapor phase etching, etc. In particular, at least one of a plasma etching process and a wet etching process may be applied. It is noted that such etching process may be performed before or after a thinning of the semiconductor wafer. In the latter case, the etched trench may extend from the frontside of the semiconductor wafer to the backside of the semiconductor wafer. In the former case, a trench may be etched on the frontside of the semiconductor wafer, wherein the trench may not necessarily extend completely to the backside of the semiconductor wafer. The semiconductor wafer may then be thinned by removing semiconductor material from the backside of the semiconductor wafer until the semiconductor wafer is separated at the position of the previously formed trench. In order to stabilize the semiconductor wafer during the thinning process and to keep the separated parts in position after the semiconductor wafer has been separated, the semiconductor wafer may be mounted on or to a carrier during the thinning process.

In plasma etching, a substrate or semiconductor wafer may be masked with a mask material, thereby leaving open areas between the individual semiconductor chips (or dies). The masked semiconductor wafer may then be processed using a reactive-gas plasma which may etch the semiconductor wafer material exposed between the semiconductor chips. Plasma etching may be performed by ionizing a gas mix inside a chamber to obtain ions that may react with the target material. An ionization of employed gases may be performed using a radio frequency excitation emitted by an electrode. A used plasma source (or etch species) may be charged (ions) and/or neutral (atoms and radicals). During a plasma etching process, the plasma may generate volatile etch products from chemical reactions between the elements of the material to be etched and the reactive species generated by the plasma. Atoms of the treated element may embed themselves on or below the surface of the target material such that the physical properties of the target material may be modified. A plasma etching of a semiconductor wafer (or substrate) may proceed partially or completely through the semiconductor wafer. In the case of a partial plasma etch, the dies may be separated by a subsequent cleaving step. The term plasma etching may refer to any suitable etching or dicing process employing a plasma, for example, Reactive Ion Etching, Deep Reactive Ion Etching, Ion Beam Etching, etc.

Chemistries of gases used in a plasma etching process may particularly depend on the material to be etched. For example, a halogen (fluorine, chlorine, bromine, or iodine) gas or halogen-containing gas may be used wherein one or more additional gases may be added in order to improve a quality of an etch (e.g., etch anisotropy, mask selectivity, etch uniformity, etc.). For example, gases including fluorine, such as $SF_6$, $F_2$ or $NF_3$, may be used for an etching of silicon. Gases including chlorine and/or bromine may be used to etch III-V materials. It is understood that plasma etching may not be limited to an application in the fabrication of semiconductor devices. Rather, a plasma etching technique may also be applied to an arbitrary substrate type as long as a suitable gas chemistry to etch the substrate is available. For example, further substrate types may include carbon containing substrates (including polymeric substrates), ceramic substrates, metal substrates, glass substrates, etc.

In wet etching, an etchant may be used to provide a trench in the semiconductor material. A mask may be used to selectively remove material from the target material. A wet etching processes may be isotropic, such that an etching rate may be identical in both horizontal and vertical direction, or anisotropic, such that an etching rate may be different in a horizontal and a vertical direction. In one example, a wet etching process may use hydrofluoric acid.

The devices and methods described herein may include or a employ a sacrificial material that may particularly act as a spacer or a mask during an etching process. The sacrificial layer may include at least one of a nitride, an oxide, and carbon. In particular, the sacrificial material may be made of or may include at least one of silicon nitride and silicon oxide. For example, the sacrificial material may be deposited in form of a layer having a thickness from about 100 nanometers to about 10 µm (micrometers), more particular from about 100 nanometers to about 3 µm (micrometers). A deposition of the sacrificial material may be similar to a deposition of the electrically conductive material described above.

FIG. 1 schematically illustrates a cross-sectional view of a device 100 in accordance with the disclosure. The device 100 may include a semiconductor chip 1 having a frontside 2, a backside 3 and a side surface 4 extending from the backside 3 to the frontside 2. The side surface 4 may include a first region 5 and a second region 6, wherein a level of the first region 5 may be different from a level of the second region 6. The device 100 may further include an electrically conductive material 7 that may be arranged over the backside 3 of the semiconductor chip 1 and over the first region 5 of the side surface 4. It is noted that the electrically conductive material 7 arranged over the backside 3 of the semiconductor chip 1 may be structured or not. The second region 6 of the side surface 4 may be uncovered by the electrically conductive material 7. It is noted that more detailed devices similar to the device 100 as well as methods for manufacturing such devices are described below.

The semiconductor chip 1 may have an arbitrary thickness $h_1$ that may particularly be smaller than or equal to 100 μm (micrometers). In FIG. 1, a transition between the levels of the first region 5 and the second region 6 has the form of a step of width b. However, it is understood that the transition may also be of different arbitrary shape as will become more clear from the following description. A difference between the level of the first region 5 and the level of the second region 6 may lie in a range from about 100 nanometers to about 10 μm (micrometers).

The first region 5 may be or may include a peripheral region of the side surface 4, wherein the peripheral region may be arranged adjacent to the backside 3 of the semiconductor chip 1. In addition, a part of the electrically conductive material 7 arranged over the backside 3 of the semiconductor chip 1 and a part of the electrically conductive material 7 arranged over the first region 5 may be continuous. A height $h_3$ of the first region 5 may lie in a range from about 1 μm (micrometer) to about 50 μm (micrometers), and more particular in a range from about 4 μm (micrometers) to about 15 μm (micrometers). Possible values of a height $h_2$ of the second region 6 may be implied by the mentioned possible values of $h_1$ and $h_3$.

Figure 2A:
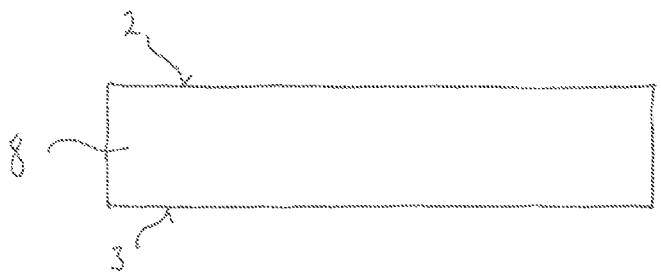
FIGS. 2A to 2D schematically illustrate a cross-sectional view of a method for manufacturing a device in accordance with the disclosure.
Figure 2B:
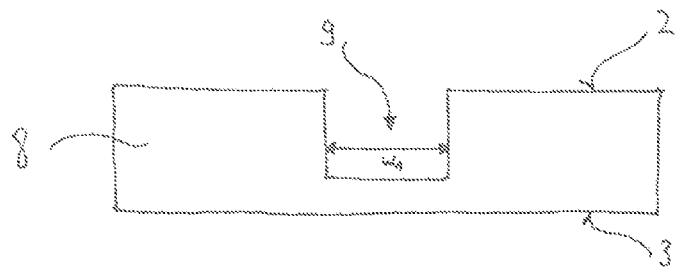
Figure 2C:
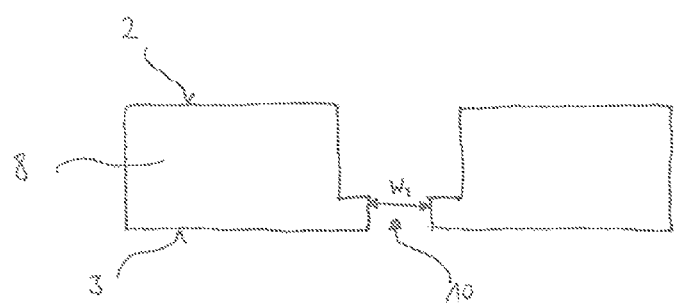
Figure 2D:
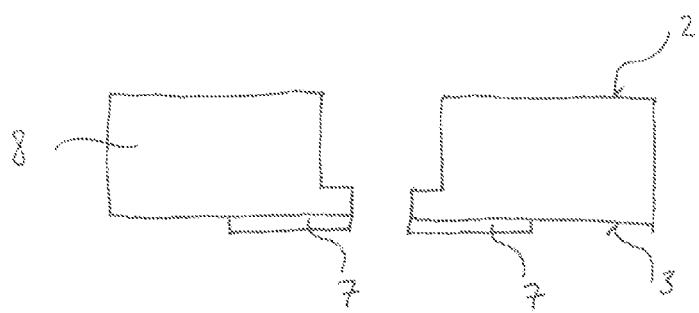

FIGS. 2A to 2D schematically illustrate a cross-sectional view of a method for manufacturing a device in accordance with the disclosure. In a first step (see FIG. 2A), a semiconductor wafer 8 including a frontside 2 and a backside 3 may be provided. In a second step (see FIG. 2B), semiconductor material may be removed to form a first part 9 of a trench, wherein the first part 9 of the trench may have a first width $w_1$. In FIG. 2B, the first part 9 of the trench is illustrated to have a rectangular shape. However, it is understood that the first part 9 of the trench may also have a different arbitrary shape as will become more clear from the following description. In a third step (see FIG. 2C), semiconductor material may be removed to form a second part 10 of the trench, wherein the second part 10 of the trench may have a second width $w_2$ smaller than the first width $w_1$. In particular, the semiconductor material may be removed in a direction towards the backside 3 of the semiconductor wafer 8. In FIG. 2C, the second part 10 of the trench is illustrated to have a rectangular shape. It is understood that the second part 10 of the trench may also have a different arbitrary shape as will become more clear from the following description. The trench including the first part 9 and the second part 10 may extend from the frontside 2 of the semiconductor wafer 8 to the backside 3 of the semiconductor wafer 8. In a fourth step (see FIG. 2D), an electrically conductive material 7 may be deposited over the backside 3 of the semiconductor wafer 8. It is understood that the illustrated method may include further steps. For example, the semiconductor wafer 8 may be separated into multiple devices at the position of the trench. The obtained devices may be similar to the device 100 of FIG. 1. A more detailed method similar to the method of FIGS. 2A to 2D is described below.

FIGS. 3A to 3G schematically illustrate a cross-sectional view of a method for manufacturing a device in accordance with the disclosure. The manufactured device can be seen as an implementation of the device 100 of FIG. 1 and a device manufactured according to the method of FIGS. 2A to 2D. Details of the device may thus be likewise applied to all further devices in accordance with the disclosure. In addition, the method illustrated in FIGS. 3A to 3G may be seen as an implementation of the method illustrated in FIGS. 2A to 2D. Details of the manufacturing method that are described below may therefore be likewise applied to the method of FIGS. 2A to 2D. It is noted that some components used in connection with the method of FIGS. 3A to 3G may be not explicitly illustrated for the sake of simplicity. For example, an illustration of a carrier may be omitted onto which a semiconductor wafer to be processed may be mounted.

Figure 3A:
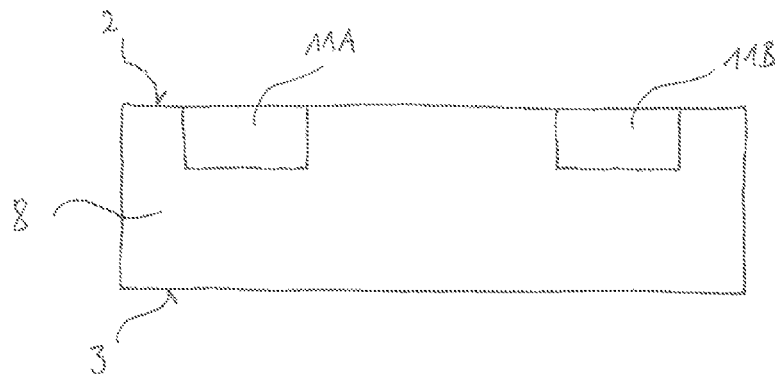
FIGS. 3A to 3G schematically illustrate a cross-sectional view of a method for manufacturing a device in accordance with the disclosure.

In FIG. 3A, a semiconductor wafer 8 having a frontside 2 and a backside 3 may be provided. It is noted that additional method steps may have been carried out before providing the semiconductor wafer 8. For example, various method steps may have been performed in order to manufacture a first semiconductor chip (or die) 11A and a second semiconductor chip (or die) 11B, respectively. It is understood that the semiconductor wafer 8 may include an arbitrary number of further semiconductor chips (not illustrated) adjacent to the semiconductor chips 11A, 11B. The semiconductor chips 11A, 11B and possible further semiconductor chips may be arranged in an arbitrary geometrical formation or array. However, it is noted that at least one of the subsequently described method steps may also be performed before a fabrication of the semiconductor chips 11A, 11B. In particular, the method steps described herein may be performed before a complete separation of the semiconductor wafer 8 into multiple semiconductor devices.

Each of the semiconductor chips 11A, 11B may have been manufactured by foregoing method steps. For example, individual devices (transistors, capacitors, resistors, etc.) may have been formed in the semiconductor wafer 8, and the formed devices may have been interconnected with a wiring in the semiconductor wafer 8. The frontside of the respective semiconductor chip 11A, 11B may thus include at least one of a doped region, an electrical component, and an integrated circuit. A manufacturing of inner electronic structures of the semiconductor chips 11A, 11B may have been completed such that a passivation layer (not illustrated) may be formed over the frontside 2 of the semiconductor wafer 8. For example, the passivation layer may include at least one of silicon nitride, silicon oxide, polyimide, epoxy, etc. Electrical contacts may be formed on the frontside 2 of the semiconductor chips 11A, 11B, wherein the electrical contacts may be configured to provide an electrical connection to electronic structures included in the respective one of the semiconductor chips 11A, 11B.

Scribe lines (not illustrated) may be arranged between the semiconductor chips 11A, 11B as well as between possible further semiconductor chips. The scribe lines may indicate locations where the semiconductor wafer 8 is to be separated into individual parts later on. In particular, the scribe lines may be free of metal that has been used during manufacturing electronic structures of the semiconductor chips 11A, 11B. The scribe lines may have a width from about 5 μm (micrometers) to about 100 µm (micrometers), and more particular from about 15 µm (micrometers) to about 50 µm (micrometers). The width of the scribe lines may particularly depend on alignment properties and/or a sensitivity of the semiconductor chips 11A, 11B and/or alignment properties of employed lithography levels. The semiconductor chips 11A, 11B may be separated from each other along the scribe lines as will be specified in the following.

Figure 3B:
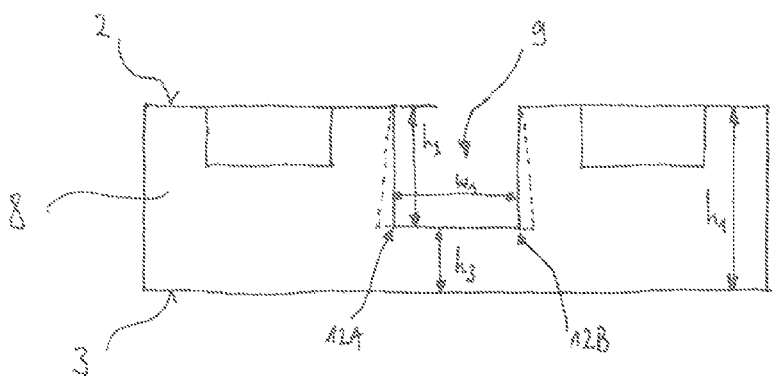

In FIG. 3B, a groove 9 (or a first part 9 of a trench) may be formed in the semiconductor wafer 8 of thickness $h_1$ by applying any suitable technique. It is to be noted that the groove 9 may be formed when the semiconductor chips 11A, 11B have already been manufactured. However, in another example the groove 9 may also be formed before the semiconductor wafer 8 is processed in order to manufacture the semiconductor chips 11A, 11B. In particular, a plasma etching process may be employed wherein a structured mask made of an etch resistant material and exposing the areas that are to be etched may be arranged over the frontside 2 of the semiconductor wafer 8. For example, the mask may be patterned using a photolithographic technique. The groove 9 may have a height $h_2$ and may extend from the frontside 2 of the semiconductor wafer 8 in a direction towards the backside 3 of the semiconductor wafer 8. In addition, the groove 9 may have a width $w_1$ lying in a range from about 1 µm (micrometers) to about 100 µm (micrometers), more particular from about 3 µm (micrometers) to about 20 µm (micrometers). It is noted that the width $w_1$ of the groove 9 may particularly depend on the width of a scribe line on which the groove 9 may be formed. A distance $h_3$ between the bottom of the groove 9 and the backside 3 of the semiconductor wafer 8 may lie in a range from about 1 µm (micrometer) to about 50 µm (micrometers), more particular in a range about 4 µm (micrometers) to about 15 µm (micrometers). It is noted that the groove 9 may also be formed by multiple process steps, for example, multiple successive plasma etching steps. In this case, the first part 9 of the trench may include multiple parts or sections that may have different widths.

In FIG. 3B, the cross section of the groove 9 is illustrated to have a rectangular shape. It is understood that the groove 9 may also have a different shape, for example, semicircular, U-shaped, V-shaped, etc. In addition, the sidewalls of the groove 9 may undulate, for example, with an amplitude from about 100 nm to about 5 µm (micrometers), and more particular from about 100 nm to about 500 nm. In particular, the sidewalls may undulate when the groove 9 may have been formed on the basis of a time-modulated two-phase etching process including a first phase, in which an isotropic plasma etching step may be performed, and a second phase, in which a passivation layer that may be configured to protect the side walls of the groove 9 during the etching step may be deposited. The etching step of the first phase and the deposit step of the second phase may be repeated multiple times resulting in multiple etching steps taking place at the bottom of the groove 9 leading to the mentioned undulation (or wave form or wave shape) of the sidewalls. For example, the method steps of the first and second phase may be repeated 10 times to 100 times. It is to be noted that the amplitude of the undulation as well as the depth of the etched groove 9 may particularly depend on the number of repetitions of the method steps of the first and second phase. In particular, the amplitude of the undulation may decrease with an increased number of repetitions (for a given thickness of the semiconductor wafer 8). It is noted that employing an etching process for forming the groove 9 may avoid damage of the semiconductor material at the side walls of the groove 9 (compared to processes like sawing or laser dicing which may result in damage of the semiconductor material). In one example, the side walls of the groove 9 may remain free of defects extending from the side walls into the semiconductor material. In another example, defects extending from the side walls into the semiconductor material may occur, wherein a dimension of the defects may be smaller than 20 µm (micrometers), more particular smaller than 10 µm (micrometers), and even more particular smaller than 5 µm (micrometers). Contrarily, applying, e.g., a dicing method for forming the groove 9 may result in defects of the semiconductor material extending from the sidewalls into the semiconductor wafer 8, wherein the defects may have a dimension of about 20 µm (micrometers) for the case of mechanical dicing and a dimension of about 100 µm (micrometers) for the case of laser dicing. It is further understood that the groove 9 may also extend in a direction perpendicular the drawing plane of FIG. 3B, in particular in a direction along the scribe lines. Corners 12A and 12B at the bottom of the groove 9 may not necessarily have a sharp edge, but may be rounded. In addition, when employing a plasma etching technique for forming the groove 9, the width $w_1$ of the groove 9 may increase in a direction from the frontside 2 of the semiconductor wafer 8 to the bottom of the groove 9, i.e., the groove 9 may have a tapered shape indicated by dashed lines.

Figure 3C:
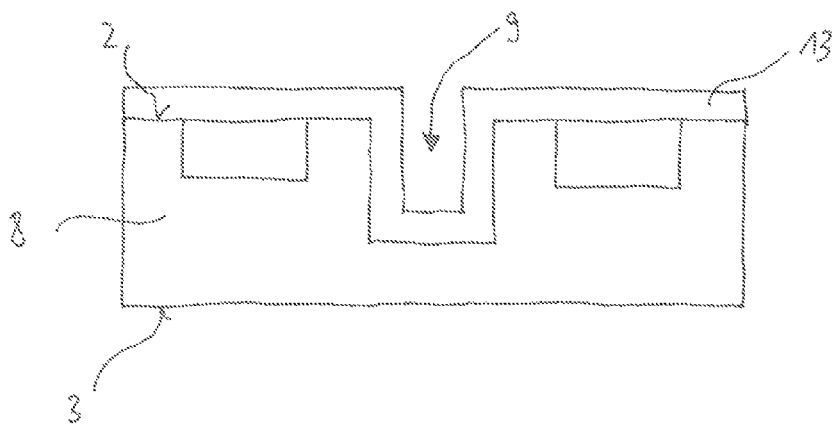

In FIG. 3C, a sacrificial material 13 may be deposited over the frontside 2 of the semiconductor wafer 8, over the sidewalls of the groove 9 and over the bottom of the groove 9. For example, the sacrificial material 13 may be deposited in form of a layer having a thickness from about 100 nanometers to about 10 µm (micrometers), more particular from about 100 nanometers to about 3 µm (micrometers). In one example, such sacrificial layer may completely cover the mentioned surfaces. In particular, the thickness of the sacrificial material 13 may be chosen such at least a part of the groove 13 remains unfilled by the sacrificial material 13. The sacrificial material 13 may be made of or may include at least one of a nitride, an oxide, and carbon.

Depositing the sacrificial material 13 may involve a low temperature process employing a low temperature material. In particular, the sacrificial layer 13 may be chosen such that a compatibility to other steps of the described manufacturing method may be provided. For example, a metallization on the frontside 2 of the semiconductor wafer 8 may be only durable to a critical temperature, but not above. The properties of the sacrificial material 13 may then particularly be chosen such that depositing the sacrificial material 13 may be performed at temperatures lower than the critical temperature. Damage of the further components, for example, a metallization arranged over the frontside 2 of the semiconductor wafer 8 may thus be avoided.

Figure 3D:
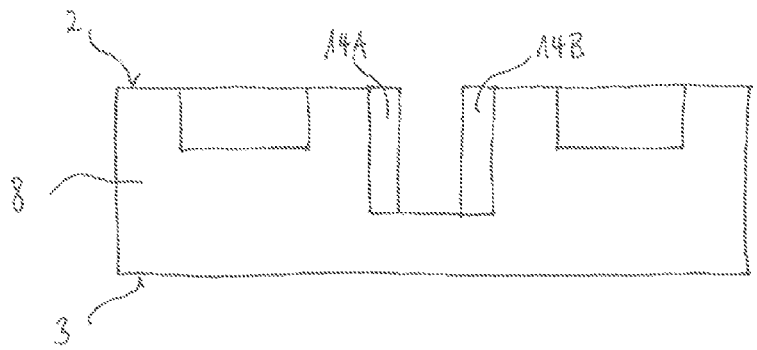

In FIG. 3D, the sacrificial material 13 arranged over the frontside 2 of the semiconductor wafer 8 and over a part of the bottom of the groove 9 may be removed such that parts 14A, 14B of the sacrificial material 13 arranged over the sidewalls of the groove 9 may remain. It is understood that the sacrificial material 13 may also at least partly remain over the frontside 3 of the semiconductor wafer 8, for example, when a thickness of the sacrificial material 13 arranged over the frontside 3 of the semiconductor wafer 8 is greater than a thickness of the sacrificial material 13 arranged over the part of the bottom of the groove 9. For removing the sacrificial material 13 as described in connection with FIG. 3D, a plasma etching process may be employed. It is noted that parameters of the plasma etching process performed in connection with FIG. 3D may differ from parameters of a plasma etching process performed in connection with FIG. 3B.

Parts (or particles) of a plasma used in connection with FIG. 3D may process (or impinge or hit) the sacrificial material 13 in a direction perpendicular to the frontside 2 of the semiconductor wafer 8. For example, parts of the plasma may be charged and accelerated in the perpendicular direction by a corresponding electrical field. That is, the amount of plasma processing the sacrificial material 13 arranged over the sidewalls of the groove 9 may be smaller than the amount of plasma processing the sacrificial material 13 arranged over the frontside 2 of the semiconductor wafer 8 and/or over the bottom of the groove 9. Hence, the plasma etching process performed in connection with FIG. 3D may be referred to as anisotropic. Due to such anisotropic character of the plasma etching process, an application of a patterned etching mask may be avoided.

It is noted that the parts 14A, 14B of the sacrificial material 13 may also be formed by a different process. For example, a polymeric material may be generated during a plasma etching process performed in connection with FIG. 3B. Generated polymers may result from a chemical reaction between parts of the plasma and material of the processed semiconductor wafer 8. During the plasma etching process of FIG. 3B, the polymers may be (an arbitrary number of times) alternately generated at the bottom and the sidewalls of the groove 9 and (at least partly) removed. By controlling the rate of generated polymeric material and the rate of removed polymeric material, it may be possible to form polymeric layers on the sidewalls of the groove 9. Such formed polymeric layers may be used similar to the parts 14A, 14B of the sacrificial material 13 as previously described.

Figure 3E:
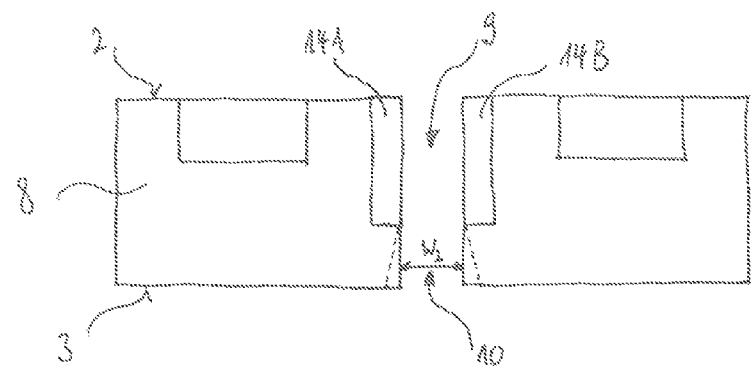

In FIG. 3E, a second part 10 of a trench may be formed by removing semiconductor material from the bottom of the groove 9. It is noted that comments made in connection with forming the groove 9 of FIG. 3B may also hold true for forming the second part 10 of the trench. In particular, a plasma etching technique may be used in this connection wherein a structured mask made of an etch resistant material and exposing the areas that are to be etched may be arranged over the frontside 2 of the semiconductor wafer 8. For example, such mask may be fabricated on the basis of a photolithographic technique. It is noted that a shape of a mask used in connection with FIG. 3E may differ from a shape of a mask that may have been used in connection with FIG. 3B. In addition, using a mask may be avoided when sacrificial material 13 may have been left over the frontside 2 of the semiconductor wafer 8. A plasma etching process performed in connection with FIG. 3E may be performed in situ with a plasma etching performed in connection with FIG. 3D. That is, the same equipment may be used for both processes. For example, both method steps may be performed in a same plasma etcher. Note that the second part 10 of the trench may also be formed on the basis of a wet etching technique.

The parameters of the plasma etching process performed in connection with FIG. 3E may be chosen such that an etch rate of the sacrificial material 13 may be smaller than an etch rate of the semiconductor wafer 8 material. An etch rate may be defined as the difference between a thickness before the etch process and a thickness after the etch process divided by an etch time. The parts 14A, 14B of the sacrificial material 13 may thus have the functionality of a patterned mask such that it may also be possible to avoid an additional fabrication of a patterned mask as described above. However, usage of a mask may also remain necessary in order to avoid an unwanted etching of the semiconductor chips 11A, 11B.

In FIG. 3E, a cross section of the second part 10 of the trench is illustrated to have a rectangular shape. It is understood that the second part 10 of the trench may be shaped differently. In particular, when employing a plasma etching technique for forming the second part 10 of the trench, the width $w_2$ of the second part 10 of the trench may increase in a direction from the bottom of the first part 9 of the trench to the backside 3 of the semiconductor wafer 8, i.e., the second part 10 of the trench may have a tapered shape indicated by dashed lines.

Figure 3F:
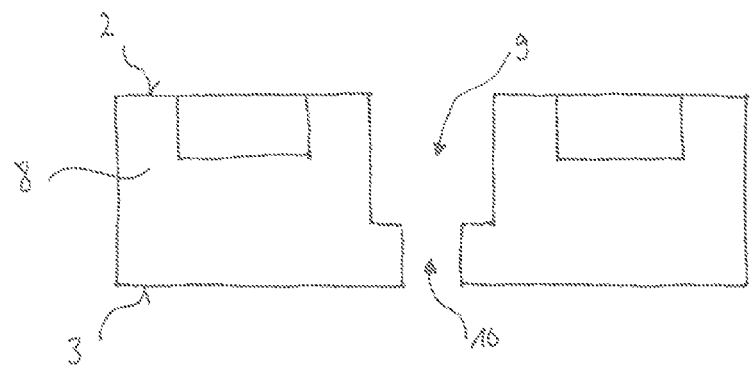

In FIG. 3F, the parts 14A, 14B of the sacrificial material 13 may (optionally) be removed.

Figure 3G:
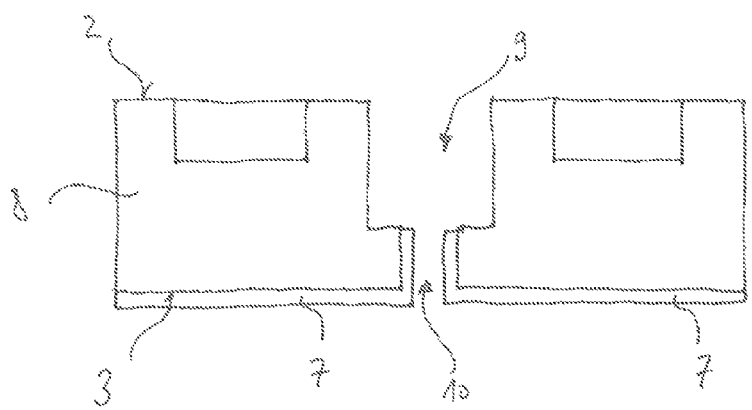
Figure 4A:
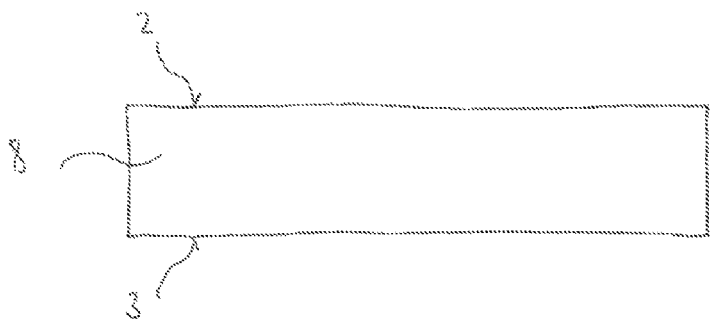
FIGS. 4A to 4D schematically illustrate a cross-sectional view of a method for manufacturing a device in accordance with the disclosure.
Figure 4B:
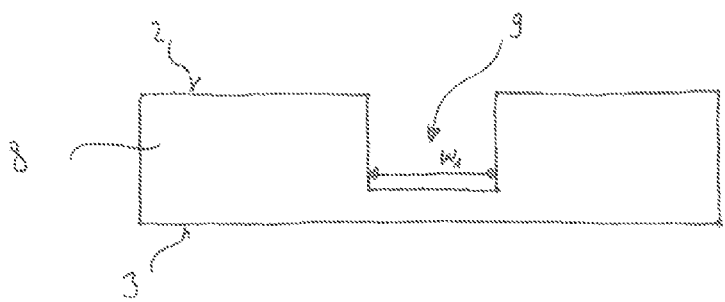
Figure 4C:
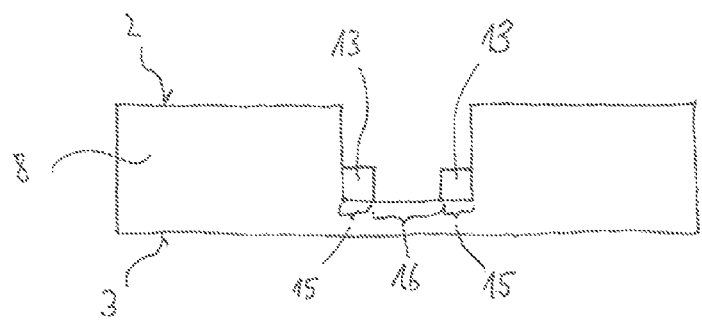
Figure 4D:
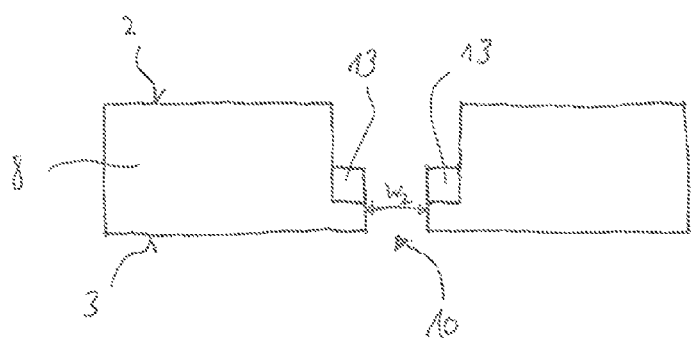

In FIG. 3G, an electrically conductive material 7 may be deposited on the backside 2 of the semiconductor wafer 8. A geometrical shape and dimension of the electrically conductive material 7 may, e.g., depend on its functionality. For example, the electrically conductive material 7 may have the functionality of a contact electrode of, e.g., a power semiconductor or may provide an electrical coupling to such contact electrode. In a further example, the electrically conductive material 7 may act as a solder contact. In yet another example, the electrically conductive material 7 may serve to stabilize the semiconductor material to avoid cracks caused by occurring stress. For example, the electrically conductive material 7 may be deposited in form of a layer having a thickness, e.g., from about 500 nanometers to about 5 μm (micrometers). It is noted that possible materials for manufacturing the electrically conductive material 7 have already been specified in foregoing paragraphs.

Since the width $w_2$ of the second part 10 of the trench may particularly be smaller than the width $w_1$ of the first part 9 of the trench, a deposition of the electrically conductive material 7 on the side surfaces of the first part 9 of the trench may be avoided. As can be seen from FIG. 3G, the side surfaces of the second part 10 of the trench may be at least partly covered by the electrically conductive material 7 while the side surfaces of the first part 9 of the trench may remain uncovered. Short circuits between the electrically conductive material 7 and components arranged over the frontside 2 of the semiconductor wafer 8 may thus be avoided. In another example, the side surfaces of the first part 9 and the second part 10 may be at least partly covered by the electrically conductive material 7, respectively. However, at least the step or transition between the first part 9 and the second part 10 may remain uncovered by the electrically conductive material 7 such that the mentioned short circuits may be avoided.

It is understood that the described method may include further method steps which are not illustrated for the sake of simplicity. For example, the semiconductor wafer 8 and the semiconductor chips included therein may be separated completely from each other at the positions of the trench. In this connection, a thinning of the semiconductor wafer 8 may be performed, for example. Multiple devices may be obtained, each of which may be similar to all further devices in accordance with the disclosure described herein.

FIGS. 4A to 4D schematically illustrate a cross-sectional view of a method for manufacturing a device in accordance with the disclosure. In a first step (see FIG. 4A), a semiconductor wafer 8 including a frontside 2 and a backside 3 may be provided. In a second step (see FIG. 4B), semiconductor material may be removed from the frontside 2 of the semiconductor wafer 8 to form a first part 9 of a trench, wherein the first part 9 of the trench may have a first width $w_1$. In a third step (see FIG. 4C), a first material 13 may be deposited over at least a first part 15 of a bottom of the first part 9 of the trench. A second part 16 of the bottom of the first part 9 of the trench may be uncovered by the first material 13. For example, the first material 13 may be deposited over the whole bottom of the first part 9 of the trench and may be removed at least over the second part 16 of the bottom of the first part 9 of the trench afterwards. In a fourth step (see FIG. 4D), semiconductor material may be removed from the second part 16 of the bottom of the first part 9 of the trench to form a second part 10 of the trench. The second part 10 of the trench may have a second width $w_2$ (in particular at the upper end of the second part 10 of the trench) smaller than the first width $w_1$ (in particular at the bottom of the first part 9 of the trench). The trench may extend from the frontside 2 of the semiconductor wafer 8 to the backside 3 of the semiconductor wafer 8. It is to be noted that the described method may include further steps. Comments made in connection with previous figures may also hold true for the method of FIGS. 4A to 4D. For example, the method may include one or more steps described in connection with FIGS. 3A to 3G.

In one example, the first part 9 and the second part 10 of the trench may be formed on the basis of a plasma etching process, respectively. However, it is noted that it may also be possible to form at least one of the first part 9 and the second part 10 of the trench on the basis of a different process, e.g., a sawing process. For example, the first part 9 of the trench may be formed based on a sawing process while the second part 10 of the trench may be formed based on a plasma etching process.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:

1. A device, comprising:
   a semiconductor chip comprising a frontside, a backside, and a side surface extending from the backside to the frontside, wherein the side surface comprises a first region and a second region, wherein a level of the first region is different from a level of the second region; and
   an electrically conductive material arranged over the backside of the semiconductor chip and over the first region of the side surface, wherein the second region of the side surface is uncovered by the electrically conductive material, wherein the first region or the second region comprises an undulation of the side surface, wherein the undulation comprises an amplitude from 100 nanometers to 5 micrometers.

2. The device of claim 1, wherein the first region comprises a peripheral region of the side surface, wherein the peripheral region is adjacent to the backside of the semiconductor chip.

3. The device of claim 1, wherein a difference between the level of the first region and the level of the second region is between 100 nanometers and 10 micrometers.

4. The device of claim 1, wherein a dimension of the first region of the side surface in a direction from the backside of the semiconductor chip to the frontside of the semiconductor chip is between 1 micrometer and 50 micrometers.

5. The device of claim 1, wherein the first region or the second region is free of defects extending from the side surface into the semiconductor chip.

6. The device of claim 1, wherein the first region or the second region is free of defects extending from the side surface into the semiconductor chip and having a dimension greater than 20 micrometers.

7. The device of claim 1, wherein the frontside of the semiconductor chip comprises a doped region, an electrical component, or an integrated circuit.

8. The device of claim 1, wherein the semiconductor chip comprises a power semiconductor chip and the electrically conductive material is electrically coupled to an electrode of the power semiconductor chip.

9. The device of claim 1, wherein a thickness of the semiconductor chip is smaller than or equal to 100 micrometers.

10. A device, comprising:
    a semiconductor chip comprising a frontside, a backside, and a side surface extending from the backside to the frontside, wherein the side surface comprises a first region and a second region, wherein a level of the first region is different from a level of the second region, and wherein, in a direction from the backside to the frontside, a level of the side surface decreases from the first region to the second region; and
    an electrically conductive material arranged over the backside of the semiconductor chip and over the first region of the side surface, wherein the second region of the side surface is uncovered by the electrically conductive material.

11. The device of claim 10, wherein a dimension of the semiconductor chip in a direction parallel to the frontside or the backside is greater at the first region than at the second region.

12. The device of claim 10, wherein the first region comprises a peripheral region of the side surface, wherein the peripheral region is adjacent to the backside of the semiconductor chip.

13. The device of claim 10, wherein a difference between the level of the first region and the level of the second region is between 100 nanometers and 10 micrometers.

14. The device of claim 10, wherein a dimension of the first region of the side surface in a direction from the backside of the semiconductor chip to the frontside of the semiconductor chip is between 1 micrometer and 50 micrometers.

15. The device of claim 10, wherein the first region or the second region is free of defects extending from the side surface into the semiconductor chip.

16. The device of claim 10, wherein the first region or the second region is free of defects extending from the side surface into the semiconductor chip and having a dimension greater than 20 micrometers.

17. The device of claim 10, wherein the frontside of the semiconductor chip comprises a doped region, an electrical component, or an integrated circuit.

18. The device of claim 10, wherein the semiconductor chip comprises a power semiconductor chip and the electrically conductive material is electrically coupled to an electrode of the power semiconductor chip.

19. The device of claim 10, wherein a thickness of the semiconductor chip is smaller than or equal to 100 micrometers.

* * * * *